(12) United States Patent
Guan et al.

(10) Patent No.: US 10,371,996 B2
(45) Date of Patent: Aug. 6, 2019

(54) DISPLAY DEVICE

(71) Applicant: WUHAN TIANMA MICRO-ELECTRONICS CO., LTD., Wuhan (CN)

(72) Inventors: Linyan Guan, Wuhan (CN); Zhiwei Zheng, Wuhan (CN); Kangpeng Yang, Wuhan (CN); Yumin Xu, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 16/161,091

(22) Filed: Oct. 16, 2018

(65) Prior Publication Data

US 2019/0049770 A1  Feb. 14, 2019

(30) Foreign Application Priority Data

Oct. 31, 2017 (CN) .......................... 2017 1 1047594

(51) Int. Cl.
| | | |
|---|---|---|
| *G02F 1/1345* | (2006.01) | |
| *G02F 1/133* | (2006.01) | |
| *G02F 1/1362* | (2006.01) | |
| *H05K 1/02* | (2006.01) | |
| *H05K 1/18* | (2006.01) | |
| *H01L 27/32* | (2006.01) | |

(Continued)

(52) U.S. Cl.
CPC ...... *G02F 1/13452* (2013.01); *G02F 1/13306* (2013.01); *G02F 1/136286* (2013.01); *H01L 27/3225* (2013.01); *H01L 27/3276* (2013.01); *H05K 1/028* (2013.01); *H05K 1/189* (2013.01); *G02F 2201/56* (2013.01); *G09G 3/3208* (2013.01); *G09G 3/36* (2013.01); *G09G 2310/0202* (2013.01); *H01L 51/0096* (2013.01); *H05K 2201/056* (2013.01); *H05K 2201/10128* (2013.01); *H05K 2201/10136* (2013.01)

(58) Field of Classification Search
USPC ........................................................ 361/749
See application file for complete search history.

(56) References Cited

U.S. PATENT DOCUMENTS

2015/0378191 A1* 12/2015 Dong ................ G02F 1/133784
349/106
2017/0196133 A1* 7/2017 Yamaguchi ............. H01L 24/03

FOREIGN PATENT DOCUMENTS

| CN | 104916252 A | 9/2015 |
| CN | 106847085 A | 6/2017 |

\* cited by examiner

*Primary Examiner* — Andargie M Aychillhum
(74) *Attorney, Agent, or Firm* — Kilpatrick Townsend & Stockton LLP

(57) ABSTRACT

Provided are a display device and a display device. The display device includes: a display panel, including display area and non-display area surrounding display area; and a flexible circuit board. The non-display area includes first binding area and second binding area located on two opposite sides of display area along first direction, which is parallel to the display panel. The display panel has display surface and back surface. The flexible circuit board is disposed on back surface of display panel. A driving chip is fixed on the flexible circuit board. The flexible circuit board has first end and second end. When the flexible circuit board is in bent state, first end is bent and then extended to display surface of the display panel and bound to first binding area, and second end is bent and then extended to display surface of the display panel and bound to second binding area.

12 Claims, 9 Drawing Sheets

(51) Int. Cl.
*H01L 51/00* (2006.01)
*G09G 3/36* (2006.01)
*G09G 3/3208* (2016.01)

DISPLAY DEVICE

CROSS-REFERENCE TO RELATED APPLICATIONS

The present application claims priority to Chinese Patent Application No. 201711047594.1, filed on Oct. 31, 2017, the content of which is incorporated herein by reference in its entirety.

FIELD

The present disclosure relates to the field of display technologies, and in particular, to a display device.

BACKGROUND

In the existing display panel technologies, there are two main technologies, i.e., the liquid crystal display panel technology and the organic self-luminous display panel technology. For the liquid crystal display panel, an electric field capable of controlling the deflection of liquid crystal molecules is formed by applying a voltage across the liquid crystal molecules, thereby controlling the transmission of light so as to achieve the display function of the display panel. For the organic self-luminous display panel, it adopts an organic electroluminescent material, and when a current passes through the organic electroluminescent material, the luminescent material emits light, thereby achieving the display function of the display panel.

With the development of technologies, the design of electronic products is constantly pursuing for the smooth experience for the user. At the same time, it is increasingly pursuing the sensory experience for the user, for example, performances such as the wide viewing angle, the high resolution, the high screen occupancy ratio, and the like have become selling points for the electronic products.

Therefore, providing a display device to increase the screen occupancy ratio is an urgent problem to be solved in the related art.

SUMMARY

The present disclosure provides a display device, which solves the technical problem of increasing the screen occupancy ratio In order to solve the above technical problem, the present disclosure provides a display device. The display device includes a display panel, including a display area and a non-display area surrounding the display area; and a flexible circuit board. The non-display area includes a first binding area and a second binding area located on two opposite sides of the display area along a first direction. The first direction is parallel to a plane of the display panel. The display panel has a display surface and a back surface. The flexible circuit board is disposed on the back surface of the display panel. A driving chip is fixed on the flexible circuit board. The flexible circuit board has a first end and a second end. When the flexible circuit board is in a bent state, the first end is bent and then extended to the display surface of the display panel and bound to the first binding area, and the second end is bent and then extended to the display surface of the display panel and bound to the second binding area.

BRIEF DESCRIPTION OF DRAWINGS

The accompanying drawings incorporated in and constituting a part of the description illustrate the embodiments of the present disclosure, and are used to interpret the principles of the present disclosure in combination with the description.

DESCRIPTION OF EMBODIMENTS

Figure 1:
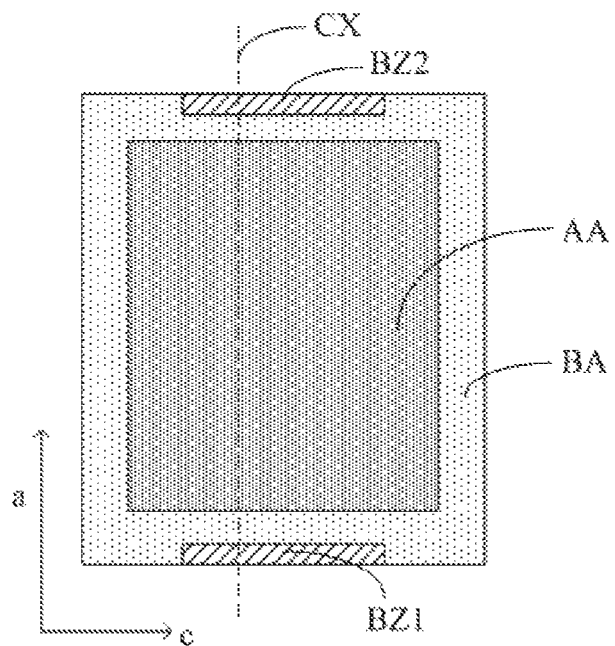
FIG. 1 is a schematic top view of a display device according to an embodiment of the present disclosure.

Embodiments of the present disclosure will now be described in detail with reference to the accompanying drawings. It should be noted that the relative arrangement of the components and steps, numerical expressions and numerical values set forth in the embodiments are not intended to limit the scope of the present disclosure.

The following description with respect to at least one embodiment is merely illustrative, and is not intended to limit applications of the present disclosure In all of the examples shown and discussed herein, any specific values are to be construed as illustrative only and not as a limitation. Thus, other examples of the exemplary embodiments may have different values.

It should be noted that similar reference numerals and letters indicate similar items in the following accompanying drawings, and therefore, once an item is defined in one drawing, it will not be further discussed in subsequent drawings.

The present disclosure relates to a display device. The display device provided by the present disclosure includes a flexible circuit board having two binding ends. A driving chip is integrated on the flexible circuit board. Two ends of the flexible circuit board are correspondingly bound to two binding areas of a display surface of the display panel, respectively. The binding area is provided therein with a binding board that is connected to the traces in the display panel. In order to achieve the conduction function and a good binding reliability, the binding board occupies a certain area in a non-display area. In the present disclosure, by dispersedly setting the binding areas and the binding boards, the width of the non-display area where the binding area is located can be narrowed, and the screen occupancy ratio can be increased.

Figure 2:
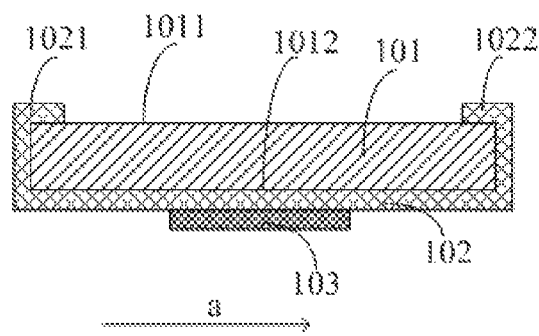
FIG. 2 is a schematic cross-sectional view of a display device according to an embodiment of the present disclosure.

The present disclosure provides a display device. With reference to FIG. 1 and FIG. 2, FIG. 1 is a schematic top view of a display device according to an embodiment of the present disclosure, and FIG. 2 is a schematic cross-sectional view of a display device according to an embodiment of the present disclosure.

With reference to FIG. 1 and FIG. 2, the display device includes a display panel 101 and a flexible circuit board 102. The display panel 101 can be a liquid crystal display panel. The liquid crystal display panel includes an array substrate, a liquid crystal molecular layer disposed on the array substrate, and a color film substrate disposed on the liquid crystal molecular layer. The display panel 101 can also be an organic light-emitting display panel. The organic light-emitting display panel includes an array substrate layer and a light-emitting device layer. The light-emitting device layer includes: an anode layer disposed on the array substrate, a light-emitting layer disposed on a side of the anode layer away from the array substrate and a cathode layer disposed on the light-emitting layer. The display panel 101 has a display area AA and a non-display area BA surrounding the display area AA. The non-display area BA includes a first binding area BZ1 and a second binding area BZ2, the first binding area BZ1 and the second binding area BZ2 are located opposite to each other along a first direction a and are arranged on two sides of the display area AA. The first direction a is parallel to a plane of the display panel. The display panel 101 includes a display surface 1011 and a back surface 1012. The display surface 1011 is a surface on which the display panel 101 can display an image, and the back surface 1012 is a surface of the array substrate away from a display component. For the liquid crystal display panel, the display component is the liquid crystal molecular layer. For the organic light-emitting display panel, the display component is the light-emitting device layer. FIG. 2 is a schematic cross-sectional view of the display device along a tangent line CX of the first direction a as shown in FIG. 1. As shown in FIG. 2, the flexible circuit board 102 is disposed on the back surface 1012 of the display panel 101. A driving chip 103 is fixed on the flexible circuit board 102. The flexible circuit board 102 includes a first end 1021 and a second end 1022. The flexible circuit board 102 is in a bent state, in which the first end 1021 is bent and then extended to the display surface 1011 of the display panel 101 and is bound to the first binding area BZ1, and the second end 1022 is bent and then extended to the display surface 1011 of the display panel 101 and is bound to the second binding area BZ2. In the present disclosure, the flexible circuit board 102 is bound and connected to the display panel 101. The first end 1021 and the second end 1022 of the flexible circuit board 102 are respectively bound to the first binding area BZ1 and the second binding area BZ2 of the display surface 1011. Each of the first binding area BZ1 and the second binding area BZ2 is provided therein with a binding board. The first end 1021 and the second end 1022 are respectively electrically connected to the respective binding boards by an anisotropic conductive film. The binding board is usually made of a metal material. The flexible circuit board is electrically connected to metal wiring in the array substrate by the binding board. Taking the liquid crystal display panel as an example, the display panel includes a plurality of data lines extending along the first direction. The binding board provided in the binding area is connected to the data line in the array substrate to provide a scan signal for the data line. The binding board also has the function of fixing the flexible circuit board 102. In order to reliably bind the binding board, the binding board needs to occupy a certain area in the non-display area BA. In a case that the display device provided by the present disclosure is a liquid crystal display device, the display device further includes a backlight device (not shown in FIG. 2) disposed between the display panel 101 and the flexible circuit board 102. It should be noted that FIG. 1 does not limit shapes of the display area AA and the non-display area BA in the display device provided by the present disclosure, and the display area AA and the non-display area BA of the display device can be in any shapes.

In the display device provided by the present disclosure, the non-display area of the display panel includes a first binding area and a second binding area disposed on opposite sides of the display surface. The flexible circuit board fixed, on which the driving chip is fixed, includes a first end and a second end. When the flexible circuit board is bent, the first end and the second end are correspondingly bound to the first binding area and the second binding area of the display surface of the display panel, respectively. The binding areas are dispersedly provided in the display device provided by the present disclosure. It is assumed that the binding area needs to be provided with x binding boards that are connected to traces in the display panel. In order to achieve conduction and reliable binding, the binding boards each need a certain area, that is, the binding board has a certain height in the first direction as shown in FIG. 1, which would affect a width of the non-display area BA of the display device in the first direction a. In the present disclosure, y binding boards can be provided in the first binding area BZ1 and z binding boards can be provided in the second binding area BZ2, where y+z=x. Then, for example, in the first binding area BZ1, the y binding boards are dispersedly arranged. In order to allow the binding board to have a certain area, a length of the binding board in a direction c perpendicular to the first direction a can be increased, and the height of the binding board in the first direction a can be decreased. That is, the height of the first binding area BZ1 in the non-display area BA along the first direction a can be decreased. In this way, the width of the non-display area BA of the display device in the first direction a can be narrowed. The arrangement of the second binding area BZ2 is the same as that of the first binding area BZ1, further achieving narrowing of the width of the non-display area BA in the first direction a. The display device provided by this embodiment of the present disclosure can narrow the width of the non-display area BA in the first direction a, reduce the area occupied by the non-display area BA, and facilitate improving the screen occupancy ratio. With the upper and lower binding areas in this embodiment, when a plurality of binding boards are provided in the binding area, the spacing between the respective binding boards can be increased to some extent so as to make the binding boards be insulated from each other. In this way, the risk of short circuit can be decreased. By binding the two ends of the flexible circuit board to the two binding areas, the connection between the flexible circuit board and the display panel can be more stable and reliable, and the performance stability of the display device can be improved.

Figure 3:
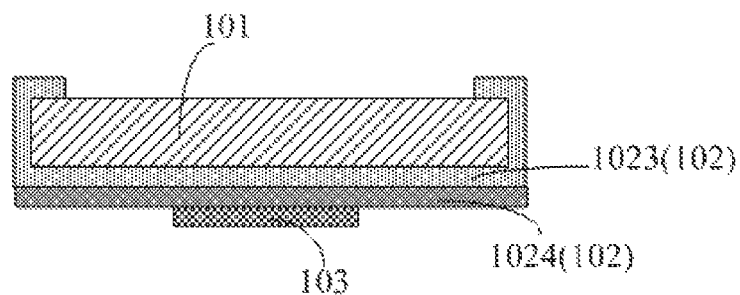
FIG. 3 is a schematic cross-sectional view showing an exemplary implementation of a display device according to an embodiment of the present disclosure.

Further, in some embodiments, FIG. 3 is a schematic cross-sectional view showing an exemplary implementation of a display device according to an embodiment of the present disclosure. As shown in FIG. 3, the flexible circuit board 102 includes a first wiring layer 1023 and a second wiring layer 1024. The second wiring layer 1024 is disposed on a side of the first wiring layer 1023 away from the display panel 101. The driving chip 103 is disposed on a side of the second wiring layer 1024 away from the first wiring layer 1023. An output signal line (not shown) is disposed in the first wiring layer 1023. The driving chip 103 includes an input pin and an output pin. The first wiring layer 1023 is provided with a plurality of output signal lines. One end of each output signal line is connected to one output pin, and the other end of the output signal line is correspondingly connected to the binding boards disposed in the first binding area and the second binding area, and is further connected to a gate driving circuit and/or the data line of the display panel, so as to control driving of the display panel. The driving chip 103 provides a signal to the display panel 101 through an output signal line. An input signal line (not shown) is disposed in the second wiring layer 1024, and the driving chip 103 receives a signal through the input signal line. The flexible circuit board further includes an interface connected to an external main driving circuit. One end of an input signal line is connected to an input pin of the driving chip 103, and the other end is connected to the external main driving circuit.

In the display device provided by this embodiment of the present disclosure, the flexible circuit board is arranged with two wiring layers. Only the output signal line for providing a signal to the display panel is disposed in the first wiring layer. The first wiring layer is closer to the display panel than the second wiring layer. The first wiring layer can be directly bound to the binding area of the display surface after it is bent, and then the trace in the first wiring layer is correspondingly bound to the binding board in the binding area. Only the input signal line for inputting a signal to the driving chip is disposed in the second wiring layer. With such an arrangement, the input signal line and the output signal line of the driving chip are in different layers, and the input signal and the output signal of the driving chip do not interfere with each other. Moreover, with this arrangement, the outer layer of the flexible circuit board (i.e., the second wiring layer) can be connected to the external input signal, and that the trace in the layer (i.e., the first wiring layer) close to display panel can be connected to the display panel. For the two binding areas arranged on the display surface of the display panel, the two ends of the flexible circuit board are correspondingly bound to the two binding areas. The flexible circuit board is firmly bound to the display panel, which can improve the performance reliability of the display device. At the same time, narrowing of the non-display area of the binding area in the display device can be achieved, which is beneficial to improving the screen occupancy ratio. In the present disclosure, providing the upper and lower binding areas on the display panel requires the driving chip to lead the output signal lines to be correspondingly connected to the binding boards of the upper and lower binding areas. A first output signal line correspondingly connected to the first binding board is arranged in the first wiring area, and a second output signal line correspondingly connected to the second binding board is arranged in the second wiring area. In a some designs, one end of the driving chip is connected to the input signal line, the other end is connected to the output signal line, and the input signal line and the output signal line are arranged in a same layer, which would cause mutual crosstalk between the input signal and the output signal. In this embodiment, the output signal line and the input signal line are arranged in different layers, thereby avoiding the problem of signal crosstalk.

Figure 4:
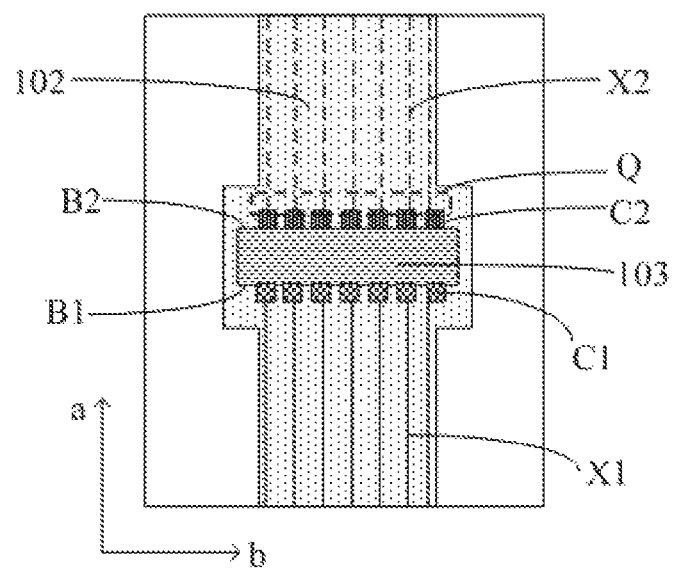
FIG. 4 is a schematic diagram showing another exemplary implementation of a display device according to an embodiment of the present disclosure.

Further, in some embodiments, FIG. 4 is a schematic diagram showing another exemplary implementation of a display device according to an embodiment of the present disclosure, and the schematic diagram shown in FIG. 4 is viewed from a back side of the display device. As shown in FIG. 4, the driving chip 103 extends along a second direction b. The second direction b is parallel to the plane of the display panel and is perpendicular to the first direction a. The driving chip 103 includes a first edge B1 and a second edge B2 that are oppositely disposed in the first direction a. Input pins C1 are arranged at the first edge B1 along the second direction b, and output pins C2 are arranged at the second edge B2 along the second direction b. Input signal lines X1 are connected to the input pins C1, and output signal lines X2 (only part of the output signal lines located in the first wiring layer is shown in the figure) are connected to the output pins C2 via the through hole. The area Q in FIG. 4 is a through hole area. In the display device provided by this embodiment, two ends of the flexible circuit board 102 are bound to the first binding area and the second binding area that are oppositely disposed in the first direction a, that is, the flexible circuit board 102 extends along the first direction a when being observed from the back side of the display device. A plurality of input pins and output pins are disposed on the driving chip 103 fixed on the flexible circuit board 102. The driving chip 103 is disposed to extend along the second direction b, that is, the output pins are arranged along the second direction, and the input pins are also arranged along the second direction, so that it is convenient for the input signal lines X1 and the output signal lines X2 to be respectively arranged on the flexible circuit board 102. That is, each pin is disposed on a straight line where a signal line connected to the pin is located. In this way, the signal line can be connected to the pin without turning. If the driving chip 103 is arranged to extend in another direction intersecting with the second direction, in order to provide a large number of output pins and input pins, pins can be disposed around the driving chip or still be disposed on two opposite sides of the driving chip as in the present disclosure. However, no matter which setting manner is adopted, lengths of the signal lines connected to the pins in the flexible circuit board are different, which may increase the difficulty of manufacturing the entire flexible circuit board, may be adverse to manufacturing, and may increase material cost. For the display device provided by this embodiment, the process for manufacturing the flexible circuit board is easy and the cost can be decreased.

Figure 5:
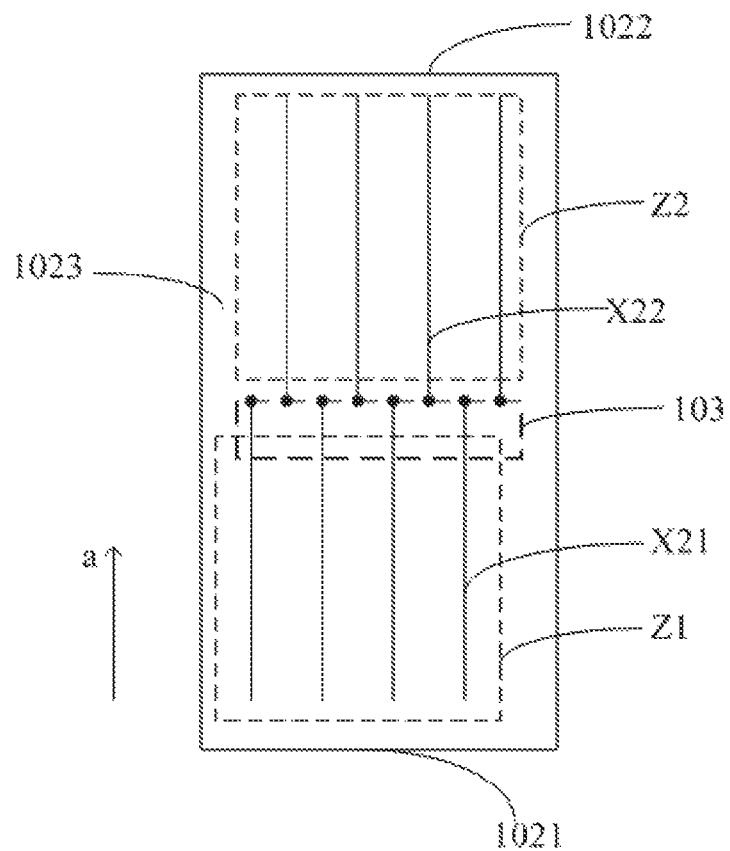
FIG. 5 is a schematic diagram of a first wiring layer of a flexible circuit board of a display device according to an embodiment of the present disclosure.

Further, in some embodiments, FIG. 5 is a schematic diagram of a first wiring layer of a flexible circuit board of a display device according to an embodiment of the present disclosure. As shown in FIG. 5, the first wiring layer 1023 is divided into a first wiring area Z1 and a second wiring area Z2. When the flexible circuit board is in an unfolded state, a first end 1021, a first wiring area Z1, a second wiring area Z2, and a second end 1022 are arranged sequentially in the first direction a. The output signal lines include a first output signal line X21 and a second output signal line X22, the first output signal line X21 is located in the first wiring area Z1, and the second output signal line X22 is located in the second wiring area Z2. The first output signal line X21 and the second output signal line X22 located in the first wiring layer 1023 are connected to the output pins of the driving chip 103 via the through hole, respectively. In this embodiment, the first output signal line X21 and the second output signal line X22 are located in different areas to avoid mutual crosstalk between the output signal lines, thereby making the output signal stable and reliable, and improving the performance reliability of the display device. At the same time, the first output signal line X21 is bound to the first binding area of the display surface through the first end 1021, and the second output signal line X22 is bound to the second binding area of the display surface through the second end 1022. That is, two ends of the flexible circuit board are bound to two binding areas and are respectively connected to the binding boards in the binding areas. By having the binding areas dispersedly provided on the display panel, the width of the non-display area can be narrowed, thereby reducing the area occupied by the non-display and thus improving the screen occupancy ratio.

Further, in some embodiments, as shown in FIG. 4, an orthographic projection of the driving chip 103 on the display panel is located at the geometric center of the display panel. In the display device provided by this embodiment, two binding areas are arranged in the non-display area, and two ends of the flexible circuit board are respectively bound to the two binding areas of the display surface, thereby achieving narrowing of the non-display area where the binding area is located. At the same time, an orthographic projection of the driving chip for providing a signal to the display panel is located at the geometric center of the display panel, so that the distance from the driving chip to the first end of the flexible circuit board is equal to the distance from the driving chip to the second end of the flexible circuit board. The first output signal line is bound to the first binding area of the display surface through the first end of the flexible circuit board, and the second output signal line is bound to the second binding area of the display surface through the second end of the flexible circuit board. In this ways, the length of the first output signal line is substantially equal to the length of the second output signal line in the first wiring layer. If the lengths of the output signal lines are different, the impedances of the respective output signal lines will be different, so that when the driving chip provides signals to the display panel, the degree of signal attenuation is different on each output signal line, or the resulting voltage drop is different after the signal flows through the respective output signal lines. In this case, there may be a difference in the signals provided to the display panel, which results in uneven brightness in the display panel, and thus results in display failure of the display panel. In this embodiment, the above problems can be avoided.

Figure 6:
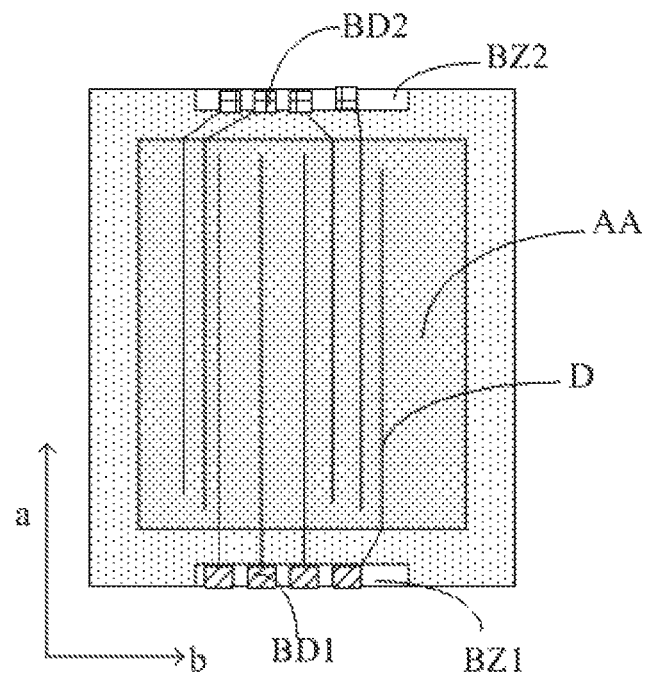
FIG. 6 is a schematic diagram showing still another exemplar) implementation of a display device according to an embodiment of the present disclosure.

Further, in some embodiments, FIG. 6 is a schematic diagram showing still another exemplary implementation of a display device according to an embodiment of the present disclosure. As shown in FIG. 6, the first binding area BZ1 is provided with a plurality of first binding boards BD1 arranged along the second direction b. The second binding area BZ2 is provided with a plurality of second binding boards BD2 arranged along the second direction b. The display area AA is provided with N data lines D extending in the first direction a. The n data lines D are correspondingly connected to the first binding boards BD1, and the m data lines are correspondingly connected to the second binding boards BD2. Here, N, n and m are all positive integers, and n+m=N. In this embodiment, a part of the data lines located in the display area is correspondingly connected to the first binding boards BD1, and another part is correspondingly connected to the second binding boards BD2. The two ends of the flexible circuit board are correspondingly bound to the first binding area BZ1 and the second binding board BD2, thereby achieving the reliability of the binding of the flexible circuit board and improving the performance stability of the display device. Moreover, this can achieve the disperse arrangement of the binding boards, thereby facilitating narrowing the width of the non-display area in the binding board, and thus improving the screen occupancy ratio.

Figure 7:
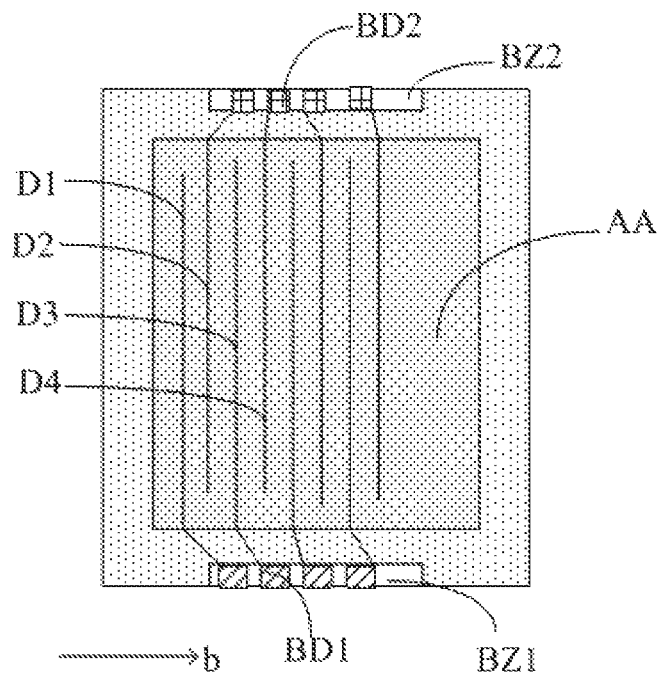
FIG. 7 is a schematic diagram showing still another exemplary implementation of a display device according to an embodiment of the present disclosure.

Further, in some embodiments, FIG. 7 is a schematic diagram showing still another exemplary implementation of a display device according to an embodiment of the present disclosure. As shown in FIG. 7, along the second direction b, the data lines include a first data line D1, a second data line D2, a third data line D3, and a fourth data line D4 to a $N^{th}$ data line. The odd-numbered data lines are connected to the first binding boards BD1 in one-to-one correspondence, and the even-numbered data lines are connected to the second binding boards BD2 in one-to-one correspondence.

When manufacturing the display panel, the plurality of first binding boards BD1 in the first binding area BZ1 is manufactured in a same process, that is, a device continuously binds the first binding boards BD1 to the display panel, and after the binding of the binding boards in the first binding area BZ1 is completed, the device needs to turn to the second binding area BZ2 and then starts to bind the plurality of second binding boards BD2 in the second binding area BZ2. In the process of transferring the binding position, the device needs a certain time. During this time, parameters in binding process will fluctuate. Parameters such as the temperature and pressure in the binding process when the device performs binding in the second binding area BZ2 will be different from that in the binding process when the device binds in the first binding area BZ1. In addition, the first binding area BZ1 and the second binding area BZ2 are located in different areas of the display panel. In the display panel, there are differences in the film layer structure, thickness, and density in different areas. Therefore, there are different requirements for parameters such as pressure and temperature during binding, so that the binding boards in the two binding areas are different in the pressing depth, etc., which is finally reflected as a difference between the impedance of the first binding board BD1 in the first binding area and the second binding board BD2 in the second binding area. As a result, the attenuation degree of the signal on the data line connected to the first binding board BD1 in the display panel is different from the attenuation degree of the signal on the data line connected to the second binding board BD2.

In this embodiment, in the display area, the data line connected to the first binding board BD1 and the data line connected to the second binding board BD2 are alternately arranged in the second direction b. That is, the first binding board BD1 and the second binding board BD2 on the display panel are alternately connected to the data lines, which means that the data lines connected to the first binding board BD1 and the second binding board BD2 are uniformly distributed in the display area, thereby balancing the brightness of the display area, avoiding the phenomenon of the display distinguishes in the display area due to the difference of the impedances of the binding boards, and thus improving the display uniformity of the display panel.

Figure 8:
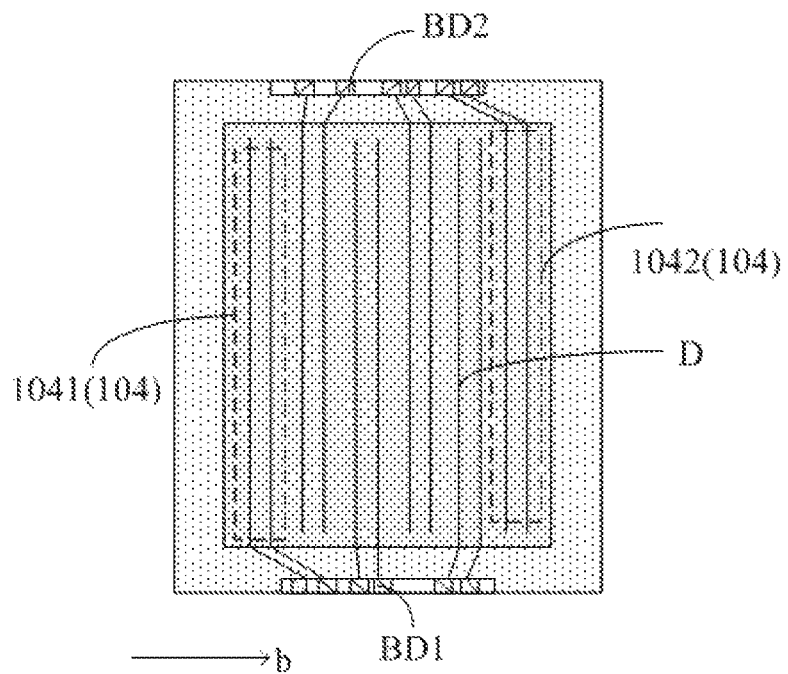
FIG. 8 is a schematic diagram showing still another exemplary implementation of a display device according to an embodiment of the present disclosure.

Further, in some embodiments, FIG. 8 is a schematic diagram showing still another exemplary implementation of a display device according to an embodiment of the present disclosure. As shown in FIG. 8, the display area AA is provided with a plurality of data line sets 104. Each data line set 104 includes at least two data lines D arranged along the second direction b. In FIG. 8, it is only an example that each data line set 104 includes two data lines D. The data line sets 104 include a first data line set 1041 and a second data line set 1042. The data lines D in the first data line set 1041 are connected to the first binding boards BD1, and the data lines D in the second data line set 1042 are connected to the second binding boards BD2. In the second direction b, the first data line set 1041 and the second data line set 1042 are alternately arranged. In this embodiment, the data lines in the display area are divided into sets, the data line sets connected to the first binding boards and the data line sets connected to the second binding boards are alternately arranged in the second direction b, thereby balancing the impedance difference between the first binding board and the second binding board generated in the manufacturing process. That is, the data line sets connected to the first binding boards BD1 and the second binding boards BD2 are uniformly distributed in the display area, thereby balancing the brightness of the display area, avoiding the phenomenon of the display distinguishes due to the difference of the impedances of the binding boards, and thus improving the display uniformity of the display panel. At the same time, in this embodiment, the data lines in the display panel are divided into a plurality of data line sets, and the data lines in the data line set are all connected to the binding boards in a same binding area. For the display panel, the data line and the binding board can be separately manufactured, which can simplify the manufacturing process. At the same time, the data lines in the display panel are divided into a plurality of data line sets, and the data lines in the data line set are all connected to the binding boards in a same binding area. As a result, the precision requirement on the manufacturing process can be decreased, thereby improving the yield.

Figure 9:
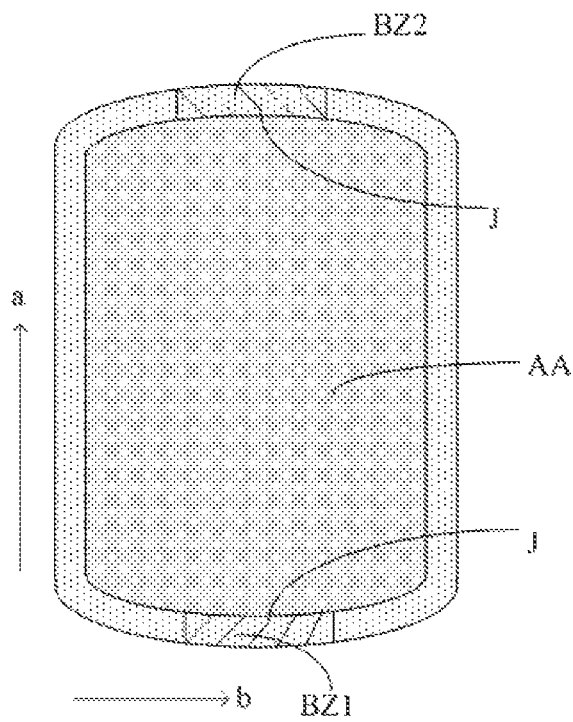
FIG. 9 is a schematic diagram showing still another exemplar) implementation of a display device according to an embodiment of the present disclosure.
Figure 10:
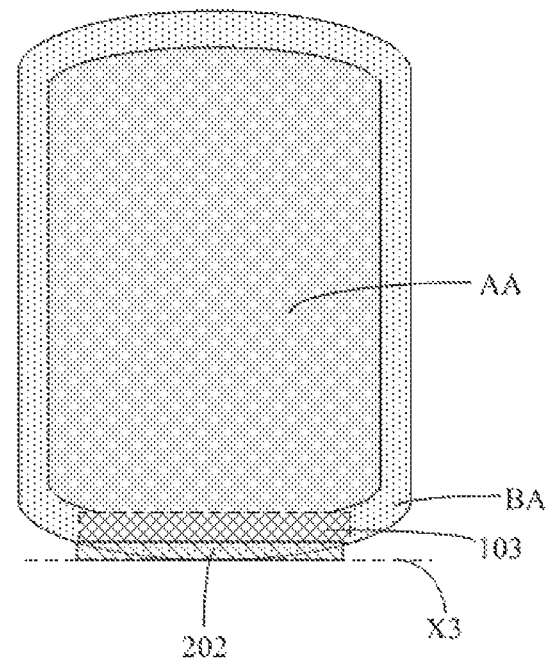
FIG. 10 is a schematic diagram of a display device in the related art.

Further, in some implementations, the display area at least partially has a first arc boundary, and the first arc boundary is a boundary between the display area and the first binding area or the second binding area. FIG. 9 is a schematic diagram showing still another exemplary implementation of a display device according to an embodiment of the present disclosure. As shown in FIG. 9, both boundaries between the display area AA and the first binding area BZ1 and between the display area AA and the second binding area BZ2 are the first arc boundaries J. The shape of the display area AA shown in FIG. 9 is only an example provided by this embodiment. FIG. 10 is a schematic diagram of a display device in the related art. As shown in FIG. 10, the shape of the display device is substantially the same as that of FIG. 9. In FIG. 10, the driving chip 103 is disposed in the non-display area BA. Since the driving chip 103 occupies a certain area, a width of the non-display area BA where the driving chip 103 is located may be increased, and an area of a portion of the display area AA may be lost.

In some setting manners, due to the complicated equipment and parameters of the manufacturing process of the binding boards in the binding area, if the binding boards are arranged along the arc so as to adapt to the arc non-display area, the parameters of the device need to be adjusted when manufacturing each binding board. As a result, the process is complicated, the manufacturing cycle-time is long, and the cost is high. Therefore, the binding boards in the binding area are usually arranged in a straight line direction, as shown in FIG. 10. If the driving chip 103 at the lower border is cancelled, and only the binding area is provided, the binding boards still need to be arranged in a straight line, and the length is long in the straight line direction. The arrangement direction of the binding boards is a linear direction, the edge of the display area AA is an arc, and the extending directions of the both are inconsistent. Therefore, a part of the display area AA should be occupied, or the non-display area BA should be enlarged, and the border of the display panel should be enlarged. In an embodiment provided by the present disclosure, as shown in FIG. 9, there are two binding areas, i.e., upper and lower binding areas, and then the length of a single binding area is shortened, so that the area of the display area AA is not occupied while the border is narrowed, and the edge of the display area AA is in an arc shape.

Figure 11:
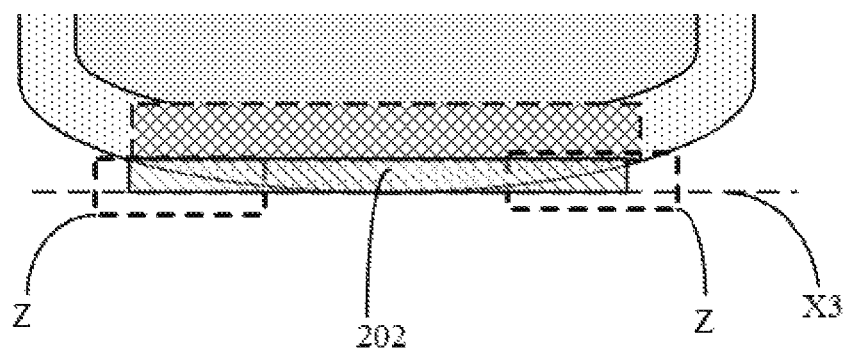
FIG. 11 is a partial enlarged view of the lower border of FIG. 10.

Continuing to compare with FIG. 9 and FIG. 10, since the non-display area BA where the binding area is located has an arc shape, when the binding boards are arranged along a straight line, as shown in FIG. 10, the non-display area BA at the lower border has an arc shape. When the flexible circuit board 202 is bound to the lower border of the display panel, the flexible circuit board 202 needs to be disposed on the back of the display panel after being bent. When the flexible circuit board 202 is being bent, a bending line X3 of the flexible circuit board 202 is a straight line, and the arc boundary of the lower border of the display panel limits the bending position of the flexible circuit board 202. An orthographic projection of the bending line X3 on the display panel is located at a tangent position of the arc boundary of the lower border of the display panel. FIG. 11 is a partial enlarged view of the lower border of FIG. 10. As shown in FIG. 11, there is a floating area Z on the left and right sides after the flexible circuit board 202 is bent. In the region Z, the flexible circuit board 202 is not supported by the display panel, and thus is easily deformed to break. Therefore, the performance reliability of the backlight device may be decreased. In this embodiment, as shown in FIG. 9, the upper and lower binding areas (i.e., the first binding area BZ1 and the second binding area BZ2) are respectively bound to the two ends of the flexible circuit board in the first direction a, and then the border can be narrowed. Moreover, since the binding areas are dispersedly arranged, the length of the binding area along the second direction b is short, and after the flexible circuit board is bent and bound to the first binding area and the second binding area, the area in which the flexible circuit board is floating in the embodiment of FIG. 9 (i.e., the area where the display panel is not supported) can be significantly decreased as compared with that in FIG. 10, thereby reducing the risk of the flexible circuit board being bent and causing the flexible circuit board to break. At the same time, the binding manner in the present disclosure can also improve the binding reliability of the flexible circuit board, and improve the performance stability of the display device.

In this embodiment of the present disclosure, the first binding boards in the first binding area BZ1 are arranged along the second direction b, and the second binding boards in the second binding area BZ2 are arranged along the second direction b, so as to achieve that the arrangement direction of the output pins of the driving chip is consistent with the arrangement direction of the binding boards. Thus, the lengths of the output signal lines correspondingly connecting the binding boards to the output pins are the same, such that the impedance difference caused by different lengths of the output signal lines can be avoided, thereby achieving display uniformity of the display panel.

It should be noted that in the abovementioned embodiments corresponding to FIG. 3 to FIG. 8, the design of the flexible circuit board in the display device, and the connection relationships between the data lines in the display area and the binding boards can be applicable to this implementation manner.

Figure 12:
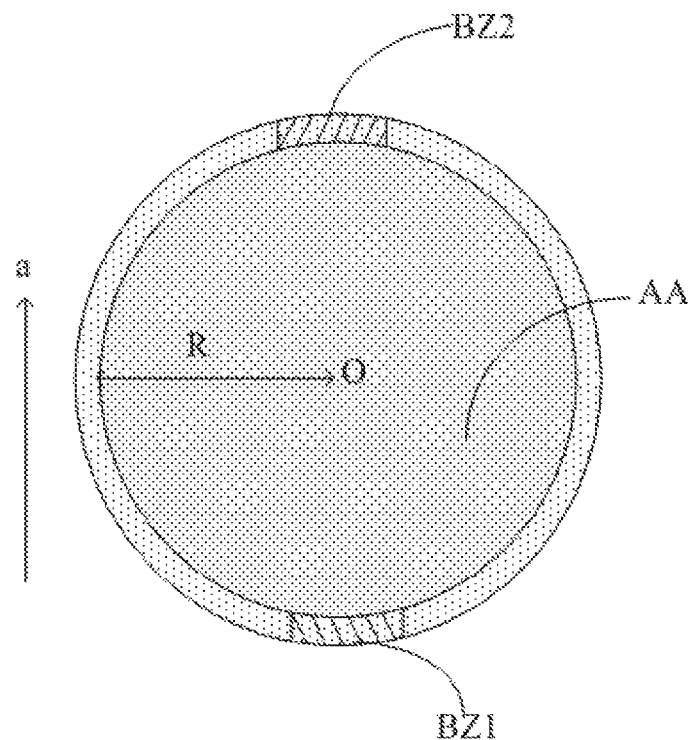
FIG. 12 is a schematic diagram showing still another exemplary implementation of a display device according to an embodiment of the present disclosure.
Figure 13:
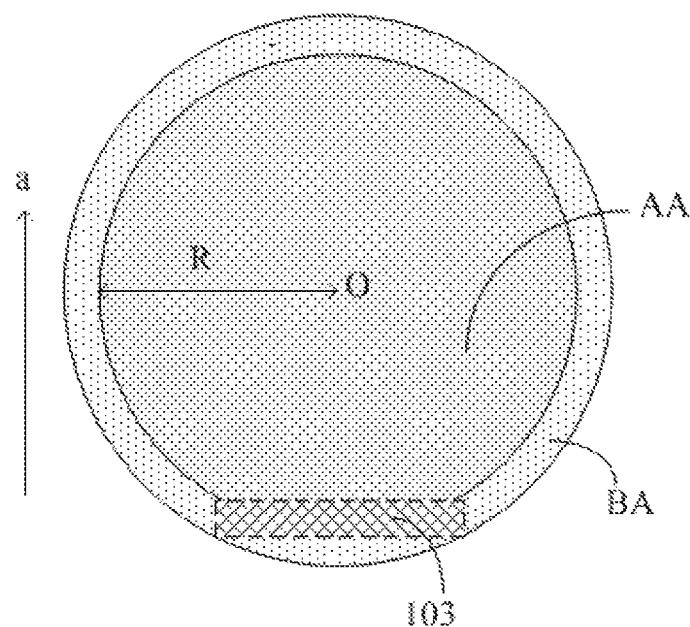
FIG. 13 is a schematic diagram of another display device in the related art.
Figure 14:
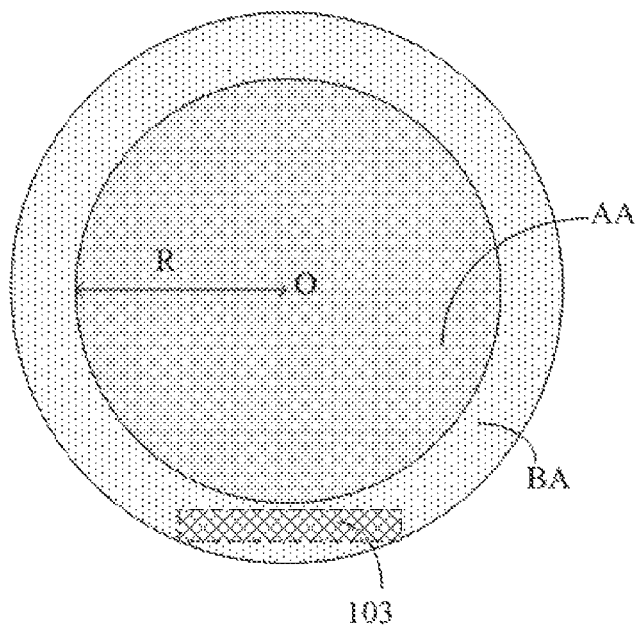
FIG. 14 is a schematic diagram of another display device in the related art.

Further, in some embodiments, FIG. 12 is a schematic cross-sectional view showing still another exemplary implementation of a display device according to an embodiment of the present disclosure. As shown in FIG. 12, the display area AA is a circular display area FIG. 13 is a schematic diagram of another display device in the related art. As shown in FIG. 13, for a display device having a circular display area, since the driving chip 103 occupies a certain area, a width of the non-display area BA provided with the driving chip 103 is increased. In order to arrange the driving chip 103, the circular display panel may lose a partial area of the display area AA as shown in FIG. 13, so that the entire display area will not be circular. In an embodiment, FIG. 14 is a schematic diagram of another display device in the related art. As shown in FIG. 14, in order to allow the display area AA to be circular as shown in FIG. 12 of the present disclosure, an overall width of the non-display area BA is widened. However, this causes the overall screen occupancy ratio of the display device to be decreased, and the visual experience of such a wide-border display device is extremely poor. Comparing FIG. 12. FIG. 13 and FIG. 14, for the three display devices based on a circular display area, the display areas are all circles based on a center O and a radius R. In this embodiment of the present disclosure, the driving chip is integrated on the flexible circuit board, other than in the non-display area, and thus the width of the non-display area BA does not need to be increased as shown in FIG. 14 for arranging the driving chip. At the same time, two binding areas are provided in the first direction a to be bound to the flexible circuit boards, thereby narrowing the width of the non-display area. The implementation manner provided by the present disclosure can make a narrower border than the one shown in FIG. 13, which is more beneficial to improving the screen occupancy ratio. At the same time, the binding manner of the present disclosure can allow the binding of the flexible circuit board and the display panel to be more reliable, and improve the performance stability of the display device.

It should be noted that in the abovementioned embodiments corresponding to FIG. 3 to FIG. 8, the design of the flexible circuit board in the display device, the connection relationships between the data lines in the display area and the binding boards can be applicable to this implementation manner. The display device provided by this embodiment is applicable to a circular smart watch or other wearable circular devices, which can make the device achieve a circular display. Moreover, the border area surrounding the circular display area is relatively narrow, thereby leading to a good overall visual effect for the device.

Figure 15:
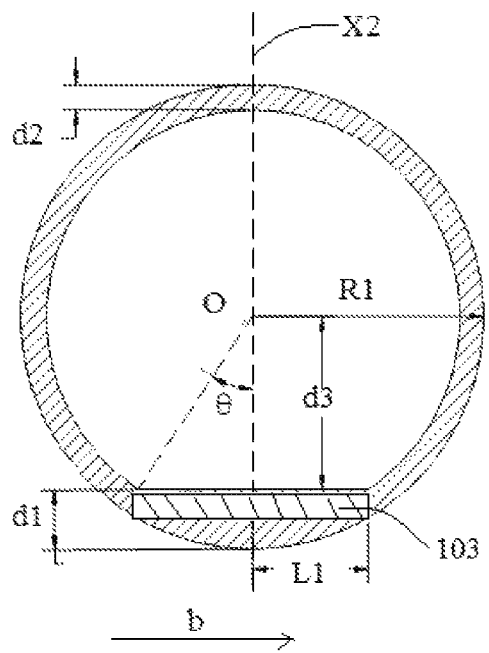
FIG. 15 is a schematic diagram of another display device in the related art.
Figure 16:
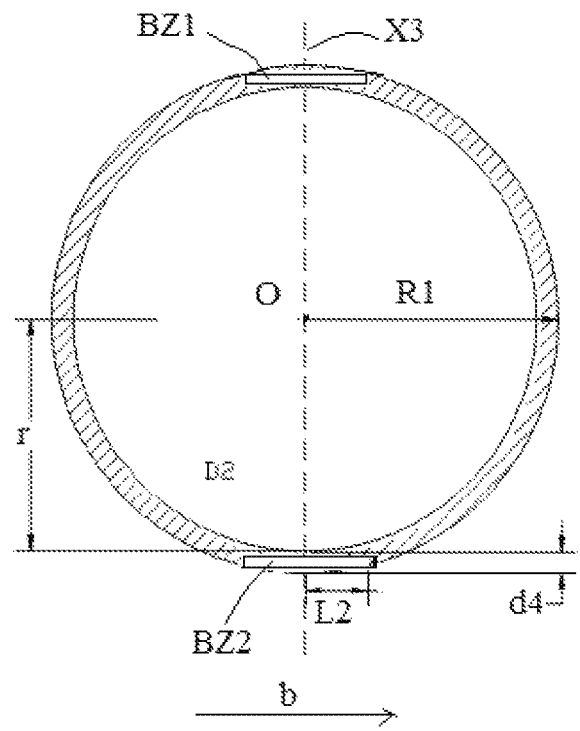
FIG. 16 is a schematic diagram showing still another exemplary implementation of a display device according to an embodiment of the present disclosure.

Based on the above embodiments, the inventors verified the effect of narrowing the border to increase the screen occupancy ratio in this embodiment. Take a circular display device having a center of O and a radius of R1=3.0000 cm (the radius is a distance from the center of the display area to the border of the display panel) as an example for comparison. FIG. 15 is a schematic diagram of another display device in the related art. FIG. 16 is a schematic diagram showing still another exemplary implementation of a display device according to an embodiment of the present disclosure.

In the related art, parameters such as the size of the driving chip 103, the radius of the display area, and the width of the non-display area are as shown in FIG. 15. The driving chip 103 is disposed at the lower border along the second direction b. The line X2 is the center line of the display device. The length L1, i.e., half length of the driving chip 103, is 1.5000 cm. The width d1 of the lower border of the display device is 0.7690 cm. The width d2 of the other border of the display device is 0.3319 cm. The distance d3 from the lower edge of the display area AA to the center O is 2.2309 cm. The angle θ is substantially 33°. The central angle of the fan shape in which the driving chip 103 is located is 2*33°=66°. Then, the area of the display area AA in the related art can be calculated as an area of a large sector (the central angle of the large sector is 360°−66°=294°) plus an area of a triangle (the triangle consists of one edge of the driving chip 103 and the two radii of the display area). It can obtain that the area of the display area AA is substantially 19.22 cm$^2$ in the related art (the mathematical operations therein will not be described herein).

For the display device provided by this embodiment of the present disclosure, as shown in FIG. 16, the entire display area AA is nearly circular. The line X3 is the center line of the display device. The length L2, i.e., half length of the first binding area BZ1 or the second binding area BZ2 along the second direction b, is 0.7446 cm. The width d4 of the border is 0.2554 cm. The radius of the circular display area is 2.7353 cm. According to the circular area calculation formula, the area of the display area AA is calculated to be about 23.45 cm$^2$.

Table 1 is a data comparison table of a border width and a display area in a display device according to an embodiment of the present disclosure and the related art.

TABLE 1 data comparison table of a border width and a display area in a display device

| Items | Related art | Embodiments of the present disclosure | Improvements |
|---|---|---|---|
| lower border/cm | ~0.77 | ~0.26 | decreased by ~66% |
| other border/cm | ~0.33 | ~0.26 | decreased by ~22% |
| display area/cm$^2$ | ~19.22 | ~23.45 | increased by ~22% |

As can be seen from the data in the above table, in the related art, the width of lower border of the display panel is 0.77 cm while the width of the other border is 0.33 cm, and the display area is only 19.22 cm. For the display panel provided by this embodiment of the present disclosure, the lower border and the other border have a same width of 0.26 cm. The display area is 23.45 cm$^2$. Compared with the related art, the border of the display panel is narrower (the width of the lower border is decreased by up to 66%), and the width of the border is uniform. That is, the area of the display area can be increased (increased by 22%) without increasing the area of the non-display area. In this way, it is beneficial to narrowing the border and miniaturizing the display panel, thereby achieving portability of the display panel. In summary, compared with the related art, this embodiment provided by the present disclosure can greatly narrow the area of the lower border while significantly increasing the area of the display area.

Figure 17:
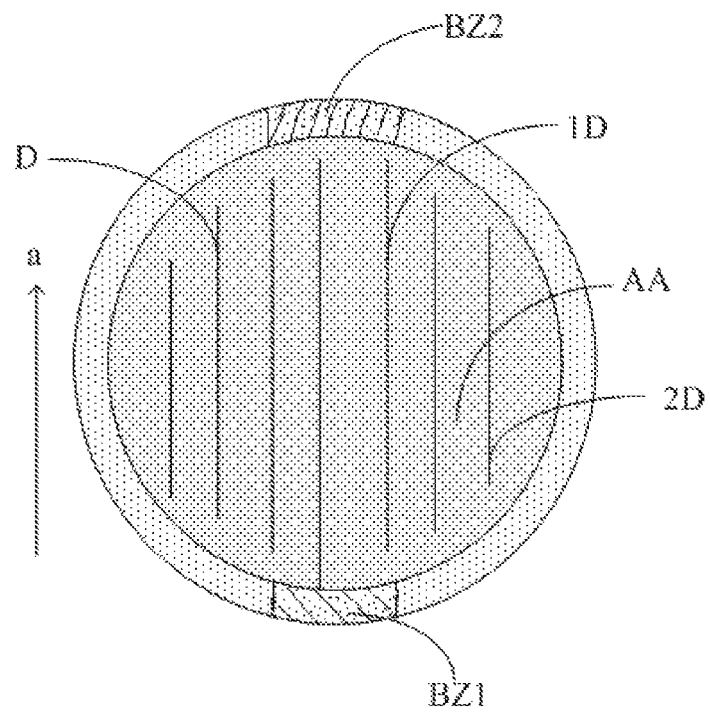
FIG. 17 is a schematic diagram showing still another exemplary implementation of a display device according to an embodiment of the present disclosure.

Further, in some embodiments, FIG. 17 is a schematic diagram showing still another exemplary implementation of a display device according to an embodiment of the present disclosure. As shown in FIG. 17, the display area AA of the display device is provided with a plurality of data lines D, which includes a long data line 1D and a short data line 2D. The length a of the long data line 1D along the first direction is larger than the length a of the short data line 2D along the first direction. The long data line 1D and the short data line 2D are respectively connected to the first binding boards located in the first binding area BZ1 or the second binding boards located in the second binding area BZ2. An area of the binding board connected to the long data line 1D is a first area, and an area of the binding board connected to the short data line 2D is a second area. The first area is smaller than the second area. The lengths of the data lines in the display area are inconsistent. The impedances of the data lines are different. The longer the data line is, the larger the impedance of the data line is. The binding board is also made of metal. In this embodiment, the smaller the area of the binding board is, the smaller the impedance of the binding board is. The area of the binding board connected to the long data line is smaller than the area of the binding board connected to the short data line. That is, the longer the data line in the display area is, the smaller the area of the binding board connected to the data line is. The impedance of the binding board is used to compensate for the impedance of the data line. When the driving chip provides a signal to the display panel, the difference between the signal attenuation on the long data line and the signal attenuation on the short data line can be decreased, thereby avoiding the phenomenon that the brightness of the display area is not uniform due to the impedance difference, and thus improving the display uniformity of the display panel.

Figure 18:
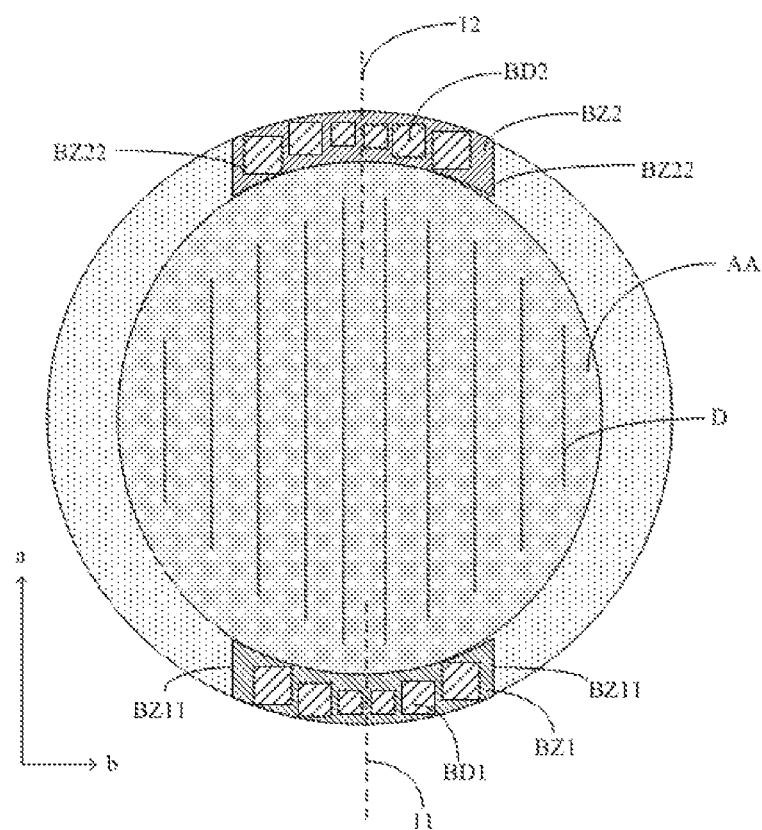
FIG. 18 is a schematic diagram showing still another exemplary implementation of a display device according to an embodiment of the present disclosure.

Further, in some embodiments, FIG. 18 is a schematic diagram showing still another exemplary implementation of a display device according to an embodiment of the present disclosure. As shown in FIG. 18, the first binding area BZ1 has a first symmetry axis 11 extending along the first direction a. Along the second direction b, from the first symmetry axis 11 to the edge BZ11 of the first binding area BZ1, an area of each first binding board BD1 becomes larger and larger. That is, as shown in FIG. 18, for the first binding boards BD1 in the first binding area BZ1, an area of each first binding board becomes larger and larger in a direction from the middle to two ends. The second binding area BZ2 has a second symmetry axis 12 extending along the first direction a. Along the second direction b, in a direction from the second symmetry axis 12 to the edge BZ22 of the second binding area BZ1, the respective area of each first binding board BD1 becomes larger and larger, that is, as shown in FIG. 18, for the second binding boards BD1 in the second binding area BZ2, the area of each first binding board becomes larger and larger in a direction from the middle to two ends. For the display device provided by this embodiment, in the display area AA, the length of each data line D in the second direction b first increases and then decreases, and the area of each first binding board BD1 in the first binding area BZ1 along the second direction b first decreases and then increases. At the same time, the area of each second binding board BD2 in the second binding area BZ2 along the second direction b first decreases and then increases. In this way, the data line D with a shorter length can be connected to a binding board with a larger area, and the data line D with a longer length can be connected to a binding board with a smaller area, thereby balancing the impedances generated by the different lengths of the data lines D. In this way, the impedance difference between the data lines D in the display area AA is small, thereby avoiding the phenomenon that the display area AA is split due to the impedance difference, and thus improving the display uniformity of the display panel.

Further, in some embodiments, as shown in FIG. 17, the data lines D include a long data line 1D and a short data line 2D, and the length of the long data line 1D is larger than the length of the short data line 2D. The output signal lines in the flexible circuit board include a short output signal line and a long output signal line, and the length of the short output signal line is smaller than the length of the long output signal line. The short output signal line provides a signal to the long data line, and the long output signal line provides a signal to the short data line. The flexible circuit board includes a first end and a second end. The first end is bent and then extended to the display surface of the display panel to be bound to the first binding area, and the second end is bent and then extend to the display surface of the display panel to be bound to the second binding area. The distance from the driving chip on the flexible circuit board to the first end is smaller than the distance from the driving chip on the flexible circuit board to the second end. That is, the short output signal line extends from the driving chip to the first end to provide a signal to the long data line, and the long output signal line extends from the driving chip to the second end to provide a signal to the short data line. In this embodiment, by adjusting the length of the output signal line that provides the signal to the data line, the impedances caused by the difference in the length of the data line D can be balanced, so that the impedance difference between the data lines D in the display area AA is small, thereby avoiding the phenomenon that the display area AA is split due to the impedance difference, and thus improving the display uniformity of the display panel.

Figure 19:
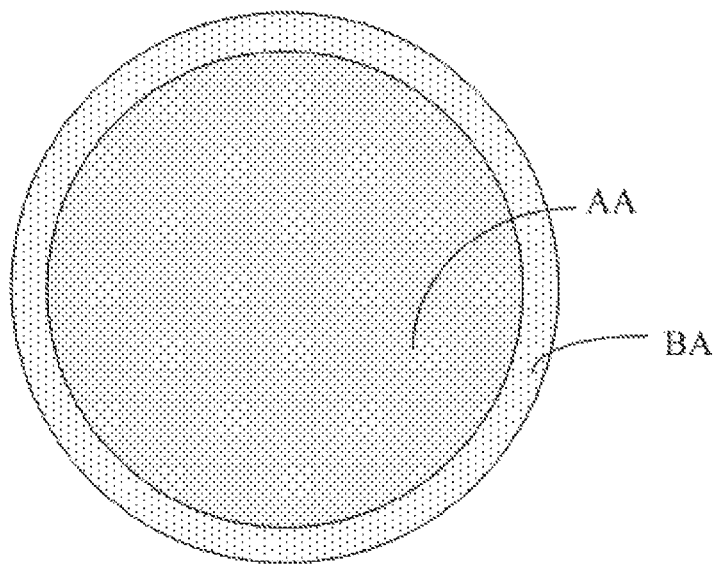
FIG. 19 is a schematic top view showing an exemplary implementation of a display device according to an embodiment of the present disclosure.

Further, the present disclosure provides a display device, including the display device according to any of the above embodiments. FIG. 19 is a schematic top view showing an exemplary implementation of a display device according to an embodiment of the present disclosure. As shown in FIG. 19, the display device includes a display area AA and a non-display area BA surrounding the display area AA, and AA in FIG. 19 is circular by way of an example. For the display device provided by the present disclosure, the non-display area of the display panel includes a first binding area and a second binding area disposed on two opposite sides of the display surface. The flexible circuit board on which the driving chip is fixed includes a first end and a second end. After the flexible circuit board is bent, the first end and the second end are respectively bound to the first binding area and the second binding area of the display surface of the display panel. In the present disclosure, the binding areas are dispersedly arranged on two sides of the display area, so that the width of the non-display area where the binding area is located can be narrowed, thereby reducing the area occupied by the non-display area, and improving the screen occupancy ratio.

It can be seen from the above embodiments that the display devices of the present disclosure achieve the following beneficial effects.

For the display devices provided by the present disclosure, the non-display area of the display panel includes a first binding area and a second binding area disposed on two opposite sides of the display surface. The flexible circuit board on which the driving chip is fixed includes a first end and a second end. After the flexible circuit board is bent, the first end and the second end are respectively bound to the first binding area and the second binding area of the display surface of the display panel. In the present disclosure, the binding areas are dispersedly arranged on two sides of the display area, so that the width of the non-display area where the binding area is located can be narrowed, thereby reducing the area occupied by the non-display area and thus improving the screen occupancy ratio.

What is claimed is:

1. A display device, comprising:
   a display panel, comprising a display area and a non-display area surrounding the display area; and
   a flexible circuit board,
   wherein the non-display area comprises a first binding area and a second binding area located on two opposite sides of the display area along a first direction, the first direction is parallel to a plane of the display panel, and the display panel has a display surface and a back surface, and
   wherein the flexible circuit board is disposed on the back surface of the display panel, a driving chip is fixed on the flexible circuit board, the flexible circuit board has a first end and a second end, when the flexible circuit board is in a bent state, the first end is bent and then extended to the display surface of the display panel and bound to the first binding area, and the second end is bent and then extended to the display surface of the display panel and bound to the second binding area,
   wherein the flexible circuit board comprises a first wiring layer and a second wiring layer disposed on a side of the first wiring layer away from the display panel, and the driving chip is disposed on a side of the second wiring layer away from the first wiring layer, and
   wherein at least one output signal line is disposed in the first wiring layer, the driving chip provides a signal to the display panel through the at least one output signal line; and wherein at least one input signal line is disposed in the second wiring layer, and the driving chip receives an external signal through the at least one input signal line.

2. The display device according to claim 1,
   wherein the driving chip extends in a second direction, and the second direction is parallel to the plane of the display panel and perpendicular to the first direction,
   wherein the driving chip has a first edge and a second edge that are disposed opposite to each other in the first direction, a plurality of input pins is arranged on the first edge along the second direction, and a plurality of output pins is arranged on the second edge along the second direction, and
   wherein the at least one input signal line is correspondingly connected to the plurality of input pins, and the at least one output signal line is correspondingly connected to the plurality of output pins through at least one through hole.

3. The display device according to claim 2,
   wherein the first wiring layer is divided into a first wiring area and a second wiring area, when the flexible circuit board is in an unfolded state, the first end, the first wiring area, the second wiring area and the second end are sequentially arranged along the first direction,
   wherein the at least one output signal line comprises at least one first output signal line and at least one second output signal line, and
   wherein the at least one first output signal line is located in the first wiring area, and the at least one second output signal line is located in the second wiring area.

4. The display device according to claim 2, wherein an orthographic projection of the driving chip on the display panel is located at a geometric center of the display panel.

5. The display device according to claim 4,
   wherein the first binding area is provided with a plurality of first binding boards arranged along the second direction, and the second binding area is provided with a plurality of second binding boards arranged along the second direction,
   wherein the display area is provided with N data lines extending along the first direction, and
   wherein n data lines of the N data lines are correspondingly connected to the plurality of first binding boards, and m data lines of the N data lines are correspondingly connected to the plurality of second binding boards; and N, n and m are positive integers, and n+m=N.

6. The display device according to claim 5,
   wherein the N data lines comprises a $1^{st}$ data line, a $2^{nd}$ data line, a $3^{rd}$ to a $N^{th}$ data line arranged along the second direction, and
   wherein odd-numbered data lines are connected to the plurality of first binding boards, and even-numbered data lines are connected to the plurality of second binding boards.

7. The display device according to claim 5,
   wherein the display area is provided with a plurality of sets of data lines, and one of the plurality of sets of data lines comprises at least two of the N data lines sequentially arranged along the second direction,
   wherein the plurality of sets of data lines comprises a first set of data lines and a second set data lines, data lines of the first set are correspondingly connected to the plurality of first binding boards, and data lines of the second set are correspondingly connected to the plurality of second binding boards, and
   wherein the first set of data lines and the second set of data lines are alternately arranged along the second direction.

8. The display device according to claim 5, wherein the display area at least partially has a first arc boundary between the display area and the first binding area or the second binding area.

9. The display device according to claim 8, wherein the display area is a circular display area.

10. The display device according to claim 9, wherein the N data lines comprise a long data line and a short data line, and a length of the long data line is larger than a length of the short data line; and
    wherein an area of the first binding board or the second binding board connected to the long data line is a first area, an area of the first binding board or the second binding board connected to the short data line is a second area, and the first area is smaller than the second area.

11. The display device according to claim 10,
    wherein the first binding area has a first symmetry axis extending along the first direction, and in the second direction, a respective area of each first binding board gradually becomes larger from the first symmetry axis to an edge of the first binding area, and
    wherein the second binding area has a second symmetry axis extending along the first direction, and in the second direction, a respective area of each second binding board gradually becomes larger from the second symmetry axis to an edge of the second binding area.

12. The display device according to claim 10, wherein the at least one output signal line comprises a short output signal line and a long output signal line, and a length of the short output signal line is smaller than a length of the long output signal line; and wherein the short output signal line provides a signal to the long data line, and the long output signal line provides a signal to the short data line.

* * * * *